US012764926B2

(12) United States Patent
Wang

(10) Patent No.: US 12,764,926 B2
(45) Date of Patent: Oct. 13, 2026

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei City (CN)

(72) Inventor: Jinghao Wang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 1144 days.

(21) Appl. No.: 17/849,950

(22) Filed: Jun. 27, 2022

(65) Prior Publication Data

US 2023/0065654 A1 Mar. 2, 2023

Related U.S. Application Data

(63) Continuation of application No. PCT/CN2022/077388, filed on Feb. 23, 2022.

(30) Foreign Application Priority Data

Aug. 30, 2021 (CN) ......................... 202111002746.2

(51) Int. Cl.
*H10D 1/68* (2025.01)
*H10B 12/00* (2023.01)

(52) U.S. Cl.
CPC ......... *H10B 12/0335* (2023.02); *H10B 12/31* (2023.02); *H10B 12/34* (2023.02); *H10D 1/716* (2025.01); *H10B 12/033* (2023.02)

(58) Field of Classification Search
None
See application file for complete search history.

(56) References Cited

U.S. PATENT DOCUMENTS 7,659,602 B2 2/2010 Tegen
2009/0294907 A1 12/2009 Tegen
(Continued)

FOREIGN PATENT DOCUMENTS

CN 100483689 C 4/2009
CN 107706206 A 2/2018
(Continued)

OTHER PUBLICATIONS

CN first office action in application No. 202111002746.2, mailed on Oct. 26, 2024.

*Primary Examiner* — William Henry Anderson
(74) *Attorney, Agent, or Firm* — Syncoda LLC; Feng Ma

(57) ABSTRACT

A semiconductor structure and a method for forming semiconductor structure are provided. The method includes: after a plurality of capacitor vias are formed in a support layer and a sacrifice layer, external electrode layers are formed on sidewall surfaces of the capacitor vias; a dielectric layer is formed on a sidewall surface of each external electrode layer; remaining sacrifice layer between the external electrode layers is removed to form a cavity at a position where remaining sacrifice layer has been removed; an internal electrode layer is formed on a surface of the dielectric layer and a bottom surface of each capacitor via; a first conductive layer completely filling the cavity is formed, where the first conductive layer is in contact with a respective one of the external electrode layers; and a second conductive layer completely filling a remaining part of each capacitor via is formed on the internal electrode layer.

20 Claims, 6 Drawing Sheets

(56) References Cited

U.S. PATENT DOCUMENTS

| | | | | |
|---|---|---|---|---|
| 2021/0134803 | A1* | 5/2021 | Cho | H10B 12/03 |
| 2021/0408225 | A1* | 12/2021 | Seo | H10D 1/696 |
| 2022/0059540 | A1* | 2/2022 | Zhao | H10D 1/042 |
| 2022/0208959 | A1* | 6/2022 | Tsai | H10B 51/20 |
| 2022/0238637 | A1* | 7/2022 | Wu | H10D 1/043 |
| 2022/0336462 | A1* | 10/2022 | Bai | H10B 12/31 |

FOREIGN PATENT DOCUMENTS

| | | | |
|---|---|---|---|
| CN | 109065501 | A | 12/2018 |
| CN | 110459533 | A | 11/2019 |
| CN | 112397509 | A | 2/2021 |
| KR | 20120005336 | A | 1/2012 |

* cited by examiner

SEMICONDUCTOR STRUCTURE AND METHOD FOR FORMING SEMICONDUCTOR STRUCTURE

CROSS-REFERENCE TO RELATED APPLICATIONS

This application is a continuation application of International Patent Application No. PCT/CN2022/077388, filed on Feb. 23, 2022, which claims priority to Chinese Patent Application No. 202111002746.2, entitled "SEMICONDUCTOR STRUCTURE AND METHOD FOR FORMING SEMICONDUCTOR STRUCTURE" and filed on Aug. 30, 2021. The disclosures of International Patent Application No. PCT/CN2022/077388 and Chinese Patent Application No. 202111002746.2 are hereby incorporated by reference in their entireties.

BACKGROUND

A Dynamic Random Access Memory (DRAM) is a semiconductor storage device commonly used in a computer, and is formed by numerous repetitive memory cells. Each memory cell usually includes a capacitor and a transistor. A gate of the transistor is connected to a word line, a drain of the transistor is connected to a bit line, and a source of the transistor is connected to the capacitor. A voltage signal on the word line can control the transistor to be turned on or off, to read data information stored in the capacitor through the bit line or write data information into the capacitor through the bit line for storage.

In a method for forming a DRAM in the related art, an internal electrode in a formed capacitor tends to bend to cause a short circuit.

SUMMARY

The present application relates to the field of memory manufacturing, and in particular, to a semiconductor structure and a method for forming a semiconductor structure.

Some embodiments of the present application provide a method for forming a semiconductor structure, including the following operations.

A base is provided.

A sacrifice layer and a support layer located on the sacrifice layer are formed on the base.

A part of the support layer and a part of the sacrifice layer are removed, to form a plurality of capacitor vias in the support layer and the sacrifice layer.

External electrode layers are formed on sidewall surfaces of the capacitor vias.

A dielectric layer is formed on a sidewall surface of each external electrode layer.

Remaining sacrifice layer between the external electrode layers is removed to form a cavity at a position where the remaining sacrifice layer has been removed.

An internal electrode layer is formed on a surface of the dielectric layer and a bottom surface of each capacitor via.

A first conductive layer completely filling the cavity is formed, where the first conductive layer is in contact with a respective one of the external electrode layers.

A second conductive layer completely filling a remaining part of each capacitor via is formed on the internal electrode layer.

An isolation layer covering the second conductive layer, the dielectric layer, the external electrode layers, the internal electrode layer, and the support layer is formed.

A plurality of openings exposing the first conductive layer and the external electrode layers is formed in the isolation layer.

A connection structure electrically connected with the first conductive layer and the external electrode layers is formed on a surface of the isolation layer and in each opening.

Some embodiments of the present application further provide a semiconductor structure, including:

- a base;
- a plurality of separate ring-shaped external electrode layers located on the base;
- a dielectric layer located on an inner sidewall of each external electrode layer;
- an internal electrode layer located on an inner sidewall of the dielectric layer and a surface of the base in a ring of each external electrode layer;
- a first conductive layer filling a space outside the ring of each external electrode layer, where the first conductive layer is in contact with a respective one of the external electrode layers;
- a second conductive layer filling a space inside the ring of the internal electrode layer, where the second conductive layer is in contact with the internal electrode layer;
- an isolation layer covering the second conductive layer, the dielectric layer, the external electrode layers, and the internal electrode layer, where an opening exposing the first conductive layer and the external electrode layers is formed in the isolation layer; and
- a connection structure that is located on a surface of the isolation layer and in the opening and is connected with the first conductive layer and each external electrode layer.

DETAILED DESCRIPTION

As discussed in the BACKGROUND, in a process of forming a DRAM, an internal electrode tends to bend to cause a short circuit.

It is found out through research that in an existing process of manufacturing a DRAM, after an internal electrode is formed, the remaining sacrifice layer needs to be removed to form a cavity. In this case, both sides of the internal electrode are suspended. The material (which is generally TiN) of the internal electrode tends to generate stress. The generated stress is likely to cause the internal electrode with two suspended sides to bend. As a result, two adjacent internal electrodes will be in contact with each other to cause a short circuit. In particular, in order to increase a capacitance value of a capacitor, when the formed capacitor via has a very large height, the internal electrode is more likely to bend to cause a short circuit.

For this, the present application provides a semiconductor structure and a method for forming a semiconductor structure, so that in a process of forming a memory, an internal electrode can be prevented from bending, to avoid a short circuit in a formed capacitor.

To make the foregoing objectives, features, and advantages of the present application more comprehensible, specific embodiments of the present application are further described below in detail with reference to the accompanying drawings. When the embodiments of the present application are described in detail, for ease of description, the schematic diagrams are not partially enlarged in accordance with the general scale, and the schematic diagrams are only examples, which should not limit the scope of protection of the present application herein. In addition, the actual production should include three-dimensional spatial dimensions of the length, width, and depth.

Figure 1:
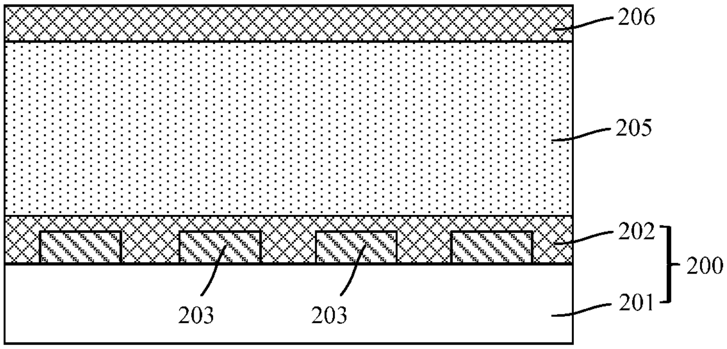
FIG. 1 to FIG. 16 are schematic diagrams of a process of forming a semiconductor structure according to some embodiments of the present application.

Referring to FIG. 1, a base 200 is provided. A sacrifice layer 205 and a support layer 206 located on the sacrifice layer 205 are formed on the base 200.

The base 200 serves as a platform for subsequent processes.

In some embodiments, the base 200 may include a semiconductor substrate 201 and an insulating layer 202 located on the semiconductor substrate 201. The material of the semiconductor substrate 201 may be silicon (Si), germanium (Ge), silicon-germanium (GeSi) or silicon carbide (SiC); or may be Silicon on Insulator (SOI) or Germanium on Insulator (GOI); or may be other materials, for example, a III-V compound such as gallium arsenide. The semiconductor substrate is doped with a particular impurity ion as required. The impurity ion may be an N-type impurity ion or a P-type impurity ion. The N-type impurity ion is one or more of a phosphorus ion, an arsenic ion or an antimony ion. The P-type impurity ion is one or more of a boron ion, a gallium ion or an indium ion. In this embodiment, the material of the semiconductor substrate 201 is silicon. A plurality of trench transistors may be formed in the semiconductor substrate. The plurality of trench transistors serve as a part of a DRAM storage device. Specifically, each trench transistor includes an active area located in the semiconductor substrate, at least one embedded gate located in the active area, and a drain area and at least one source area located in the active area on two sides of the embedded gate.

The insulating layer 202 may be a single-layer structure or multilayer stack structure. A plurality of electrode contact structures 203 are formed in the insulating layer 202. Each electrode contact structure 203 may be configured to connect an internal electrode layer of a subsequently formed capacitor and a source of the trench transistor formed in the semiconductor substrate 201 with each other.

In some embodiments, the insulating layer 202 may be a single-layer structure formed by one material of silicon oxide, silicon nitride, silicon oxynitride, Fluorine-doped Silicon Dioxide (FSG), Boron-doped Silicon Dioxide (BSG), Phosphorus-doped Silicon Dioxide (PSG), Boron- and Phosphorus-doped Silicon Dioxide (BPSG), and a low-dielectric constant material, or the insulating layer 202 may be a stack structure formed by more than two materials in a group formed by the foregoing materials. In this embodiment, the insulating layer 202 is a single-layer structure of silicon nitride or a stack structure at least with the topmost layer being a silicon nitride layer.

The material of the electrode contact structure 203 is a metal. In some embodiments, the electrode contact structure 203 may be a single-layer structure formed by one material of W, Al, Cu, Ag, Au, Co, Pt, Ni, Ti, Ta, TiN, and TaN, or the electrode contact structure 203 may be a stack structure formed by more than two materials in a group formed by the foregoing materials (for example, a double-layer stack structure formed by a TiN layer and a W layer located on the TiN layer).

In some embodiments, the formed electrode contact structure 203 is completely located in the insulating layer 202. That is, a top surface of the electrode contact structure 203 is lower than a top surface of the insulating layer 202.

The sacrifice layer 205 is configured to subsequently form a capacitor via and a capacitor. The sacrifice layer may be a single-layer structure or multilayer stack structure. The material of the sacrifice layer 205 is different from the material of the support layer 206 and the material of the insulating layer 202. In a subsequent process of etching the sacrifice layer 205 (for example, in a subsequent process of forming an initial capacitor via, increasing the dimension of the initial capacitor via, and removing the remaining sacrifice layer), etching amounts of the support layer 206 and the insulating layer 202 are very small or negligible. In some embodiments, the sacrifice layer 205 may be a single-layer structure formed by one material of silicon oxide, silicon nitride, silicon oxynitride, silicon oxycarbide, silicon carbon nitride, carbon, boron-doped silicon oxide, phosphorus-doped silicon oxide, boron nitride, silicon germanide, polycrystalline silicon, amorphous silicon, and amorphous carbon, or the sacrifice layer 205 may be a stack structure formed by more than two materials in a group formed by the foregoing materials. In this embodiment, the sacrifice layer 205 is a single-layer structure of silicon oxide.

The support layer 206 is configured to support a capacitor via and various layers of structure formed in a capacitor in a subsequent process of forming the capacitor, to maintain the mechanical stability of the capacitor and prevent the capacitor from collapsing. The support layer 206 may be a single-layer structure or multilayer stack structure. In some embodiments, the support layer 206 may be a single-layer structure formed by one material of silicon oxide, silicon nitride, silicon oxynitride, silicon oxycarbide, and silicon carbon nitride, or the support layer 206 may be a stack structure formed by more than two materials in a group formed by the foregoing materials. In this embodiment, the support layer 206 is a single-layer structure of silicon nitride.

Figure 4:
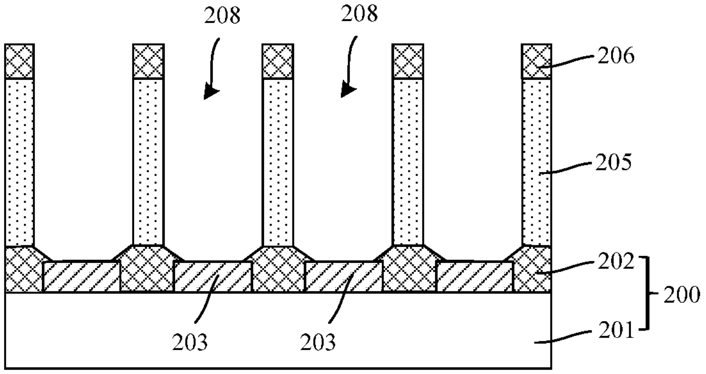
Figure 5:
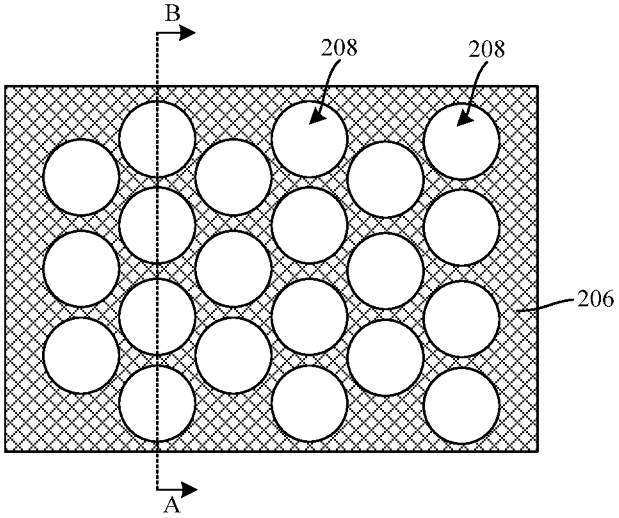

With reference to FIG. 4 and FIG. 5, FIG. 4 is a schematic sectional view of FIG. 5 taken along a cutting line AB. A part of the support layer 206 and a part of the insulating layer 202 are removed, to form a plurality of capacitor vias 208 in the support layer 206 and the insulating layer 202.

The capacitor via 208 is configured to subsequently form a capacitor. In some embodiments, the plurality of capacitor vias 208 are misaligned with each other. The bottom of each capacitor via 208 exposes a surface of a respective one of the electrode contact structures 203.

In some embodiments, a process of forming the capacitor via 208 may include: after a mask layer with a plurality of openings is formed on the support layer 206, the support layer 206 and the sacrifice layer 205 are etched along the plurality of openings by using the mask layer as a mask, to form directly the capacitor via in the support layer 206 and the sacrifice layer 205.

In this embodiment, the capacitor via 208 is formed by specific process operations. A process of forming the capacitor via 208 is described below in detail with reference to FIG. 2 to FIG. 5.

Figure 2:
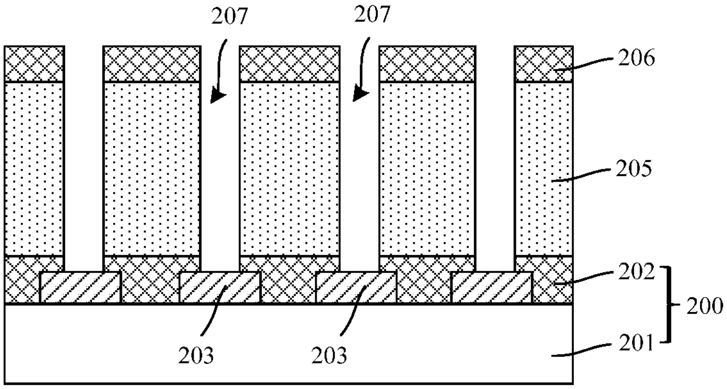

With reference to FIG. 2, a part of the support layer 206 and a part of the sacrifice layer 205 are removed by a dry etching process, to form an initial capacitor via 207 in the support layer 206 and the sacrifice layer 205.

The dry etching process is an anisotropic dry etching process, including an anisotropic plasma etching process. In this embodiment, a gas used in the anisotropic plasma etching process includes a gas containing carbon and fluorine, which may be specifically one or more of $CF_4$, $CHF_3$, $C_4F_8$ or $C_4F_6$.

In some embodiments, before the dry etching process is performed, a patterned mask layer (for example, a patterned photoresist layer) is formed on the support layer 206. The patterned mask layer is provided with a plurality of separate etch openings exposing a part of a surface of the support layer. The support layer 206 and the sacrifice layer 205 are etched along the etch openings by using the patterned mask layer as a mask, to form the initial capacitor via 207 in the support layer 206 and the sacrifice layer 205. The patterned mask layer is removed.

The dimension of the formed initial capacitor via is much less than the dimension of the subsequent eventually formed capacitor via. The bottom of the formed initial capacitor via 207 may expose a part of the surface of the electrode contact structure 203. Therefore, during the formation of the initial capacitor via, a sidewall of the formed initial capacitor via 207 can be maintained perpendicular to the surface of the semiconductor substrate or the sidewall can have a very small inclination, so that a sidewall of the subsequent eventually formed capacitor via is also perpendicular to the surface of the semiconductor substrate or the sidewall also has a very small inclination, to avoid the formation of a capacitor via with an inverted trapezoidal form. In addition, because the dimension of the formed initial capacitor via is small, the energy of plasma during etching may be relatively low, so that etching damage to the electrode contact structure 203 at the bottom is relatively small.

In some embodiments, the bottom of the formed initial capacitor via 207 may expose a part of the surface of the insulating layer 202 on the top surface of the electrode contact structure 203 (during the formation of the initial capacitor via 207, the insulating layer 202 on the top surface of the electrode contact structure 203 is not etched or is only removed by a partial thickness). Therefore, in a process of forming the initial capacitor via 207 and subsequently increasing the dimension of the initial capacitor via 207 by wet etching, the remaining part of the insulating layer 202 protects the electrode contact structure 203 from damage caused by etching.

Figure 3:
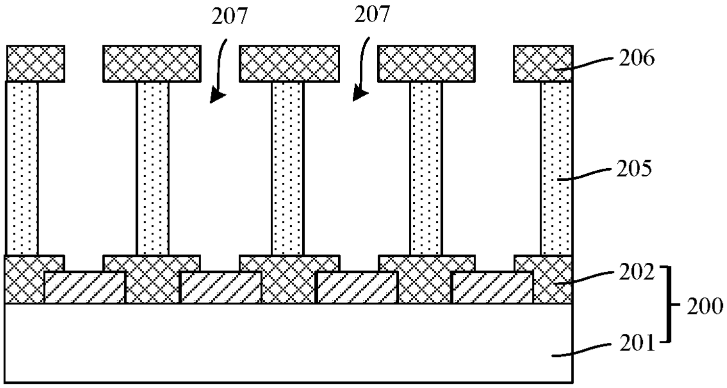

With reference to FIG. 3, the sacrifice layer 205 on the sidewall of the initial capacitor via 207 is thinned by a first wet etching process, to increase the dimension of the initial capacitor via 207.

The first wet etching process is an isotropic wet etching process. During etching, transverse etching rates at different positions of the sacrifice layer can be kept consistent or very close, so that the sidewall of the initial capacitor via 207 with the dimension increased is still perpendicular to the surface of the semiconductor substrate or the sidewall has a very small inclination. In a process of thinning the sacrifice layer 205 by the first wet etching process, the sacrifice layer 205 has high etch selectivity ratio with respect to the support layer 206 and the insulating layer 202, so that etching amounts of the support layer 206 and the insulating layer 202 are relatively small or negligible.

In this embodiment, an etching solution used in the first wet etching process includes a hydrofluoric acid solution.

With reference to FIG. 4 and FIG. 5, a part of the support layer 206 and a part of the insulating layer 202 are removed by a second wet etching process, to form a capacitor via 208 in the support layer 206 and the insulating layer 202.

The second wet etching process is an isotropic wet etching process. During etching, transverse etching rates at different positions of the support layer 206 and the insulating layer 202 can be kept consistent or very close, so that the dimension of the remaining part of the support layer 206 and the dimension of the remaining part of the sacrifice layer 205 at the bottom can be kept consistent or very close. After a part of the insulating layer 202 is removed, the surface of the electrode contact structure 203 can be more exposed. In a process of removing a part of the support layer 206 and a part of the insulating layer 202 by the second wet etching process, the support layer 206 and the insulating layer 202 have high etch selectivity ratio with respect to the sacrifice layer 205, so that an etching amount of the sacrifice layer 205 is relatively small or negligible.

In this embodiment, an etching solution used in the second wet etching process includes a concentrated phosphoric acid solution.

In some embodiments, after a part of the insulating layer 202 is removed by the second wet etching process, the bottom of the remaining part of the sacrifice layer 205 is higher than the surface of the electrode contact structure 203. The surface of the remaining part of the insulating layer 202 between the bottom of the remaining part of the sacrifice layer 205 and the surface of the electrode contact structure 203 is an inclined surface. The inclined surface of the insulating layer ensures a relatively large distance between the bottom of an external electrode layer subsequently formed on the sidewall surface of the remaining part of the sacrifice layer 205 and the bottom of the internal electrode layer subsequently formed on the surface of the electrode contact structure 203, which can more effectively prevent electric leakage between the bottom of the external electrode layer and the bottom of the internal electrode layer.

In some embodiments, with reference to FIG. 5, the plurality of formed capacitor vias 208 are arranged in columns, and capacitor vias in adjacent columns are misaligned with each other. In other embodiments, the plurality of capacitor vias may be arranged in other manners, for example, arranged in arrays.

In the present application, the capacitor via is formed by the foregoing multiple specific processes. The capacitor via can keep a relatively large dimension (the thickness of the remaining part of the sacrifice layer between adjacent capacitor vias is relatively small, and a minimum thickness is generally less than one fifth of the diameter of the capacitor via), the capacitor via has a "cylindrical" shape, and the sidewall surface of the capacitor via has more uniform morphology, so that the external electrode layer and the internal electrode layer subsequently formed in the capacitor via can have relatively large areas, thereby increasing a capacitance value of a capacitor. In addition, the surfaces of the external electrode layer and the internal electrode layer have more uniform morphology, thereby improving the electrical performance of the capacitor. Moreover, in a process of forming the capacitor via, etching damage to the electrode contact structure can be further reduced.

Figure 6:
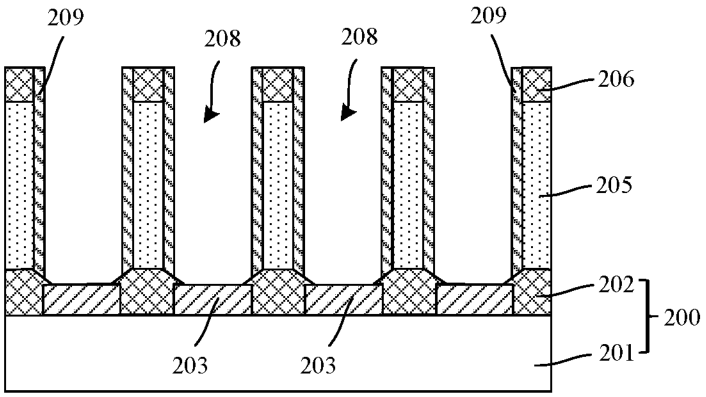

With reference to FIG. 6, external electrode layers 209 are formed on the sidewall surfaces of the capacitor vias 208.

In some embodiments, the external electrode layer 209 may be a single-layer structure formed by one material of W, Al, Cu, Ag, Au, Co, Pt, Ni, Ti, Ta, TiN, TaN, TaC, TaSiN, NiSi, CoSi, TiAl, and WSi, or the external electrode layer 209 may be a stack structure formed by more than two materials in a group formed by the foregoing materials. In this embodiment, the external electrode layer 209 is a TiN layer.

In some embodiments, a process of forming the external electrode layer includes the following operations. An external electrode material layer is formed on the sidewall surface and the bottom surface of the capacitor via 208 and a surface of the support layer 206. The external electrode material layer on the bottom surface of the capacitor via 208 and the surface of the support layer 206 is removed by a maskless etching process, in which a remaining part of the external electrode material layer on the sidewall surface of the capacitor via 208 forms the external electrode layer 209. The external electrode material layer may be formed by a process such as a physical vapor deposition process, sputtering process, sputtering coating process, electroplating process or chemical plating process. The maskless etching process may be an anisotropic plasma etching process.

Figure 7:
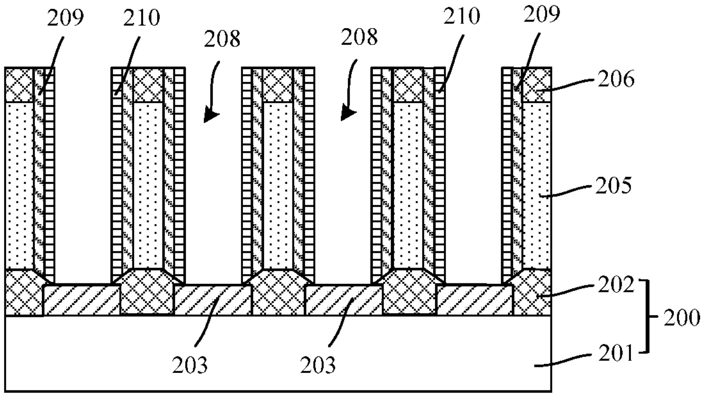

With reference to FIG. 7, a dielectric layer 210 is formed on a sidewall surface of the external electrode layer 209.

In some embodiments, the material of the dielectric layer 210 is a high-K (K is greater than 2.8) dielectric material, thereby increasing a capacitance value per a unit area of a capacitor. In specific embodiments, the dielectric layer 210 may be a single-layer structure formed by one material of $HfO_2$, $TiO_2$, HfZrO, HfSiNO, $Ta_2O_5$, $ZrO_2$, $ZrSiO_2$, $Al_2O_3$, $SrTiO_3$, and BaSrTiO, or the dielectric layer 210 may be a stack structure formed by more than two materials in a group formed by the foregoing materials. In this embodiment, the dielectric layer 210 is an $HfO_2$ layer.

In some embodiments, a process of forming the dielectric layer 210 includes the following operations. A dielectric material layer is formed on the sidewall surface of the external electrode layer 209, the bottom surface of the capacitor via 208, and a surface of the support layer 206. The dielectric material layer on the bottom surface of the capacitor via 208 and the surface of the support layer 206 is removed by a maskless etching process, in which a remaining part of the dielectric material layer on the sidewall surface of the external electrode layer 209 forms the dielectric layer 210. The dielectric material layer may be formed by a process such as a physical vapor deposition process, sputtering process, sputtering coating process, electroplating process or chemical plating process. The maskless etching process may be an anisotropic plasma etching process.

Figure 8:
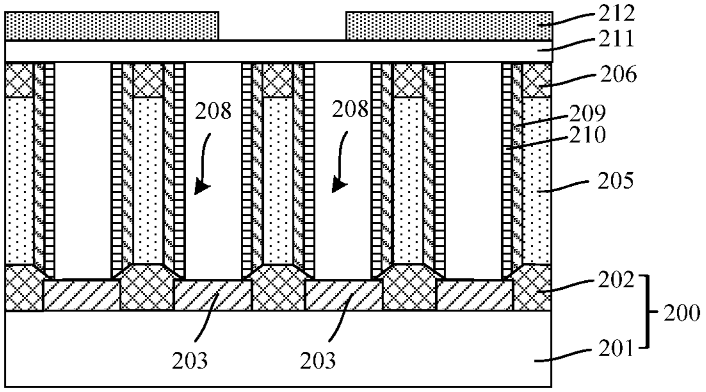
Figure 9:
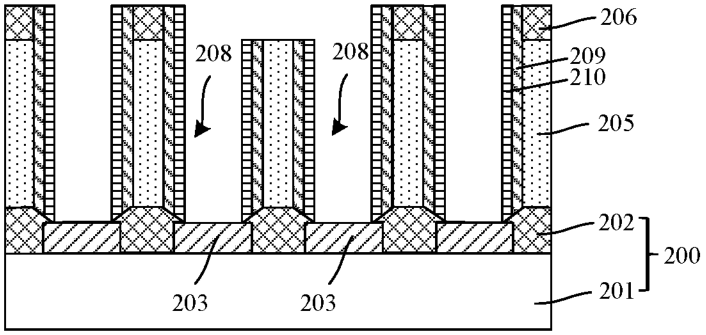

With reference to FIG. 8 and FIG. 9, a mask layer is formed on a surface of the support layer 206, a top surface of the external electrode layer 209, and a top surface of the dielectric layer 210, and above the capacitor via 208. A first opening exposing a surface of a part of the support layer 206 between adjacent capacitor vias is formed in the mask layer. The exposed support layer (with reference to FIG. 9) is removed along the first opening by using the mask layer as a mask, to expose a surface of the sacrifice layer 205 (with reference to FIG. 9) at the bottom. The mask layer is removed.

An objective of removing a part of the support layer 206 is to facilitate subsequent removal of all the sacrifice layers through the exposed sacrifice layer and further protect the overall structure of the support layer 206 from damaging, so that the support layer can still provide support functions.

The mask layer may be a single-layer structure or multi-layer stack structure. In this embodiment, the mask layer includes a first mask layer 211 and a second mask layer 212 located on the first mask layer 211. The material of the first mask layer 211 is different from the material of the support layer 206, the material of the external electrode layer 209, the material of the dielectric layer 210, the material of the insulating layer 202, and the material of the electrode contact structure 203. The material of the first mask layer 211 may be one of silicon oxide, silicon nitride, silicon oxynitride, silicon oxycarbide, and silicon carbon nitride. The material of the second mask layer 212 is a photoresist. After the second mask layer 212 is patterned by a photolithography process (including an exposure process and a development process), the first mask layer 211 is etched to form an opening.

There may be plurality of first openings (the number of the first openings is greater than or equal to 2). If the plurality of first openings are spaced apart from each other, each first opening exposes a respective one of the support layers 206 between adjacent capacitor vias.

In some embodiments, the support layer is removed along the first opening by an anisotropic dry etching, including an anisotropic plasma etching process. It needs to be noted that during the removal of the support layer along the first opening, a part of the external electrode layer 209 and a part of the dielectric layer 210 at the bottom of the first opening are also removed.

Figure 10:
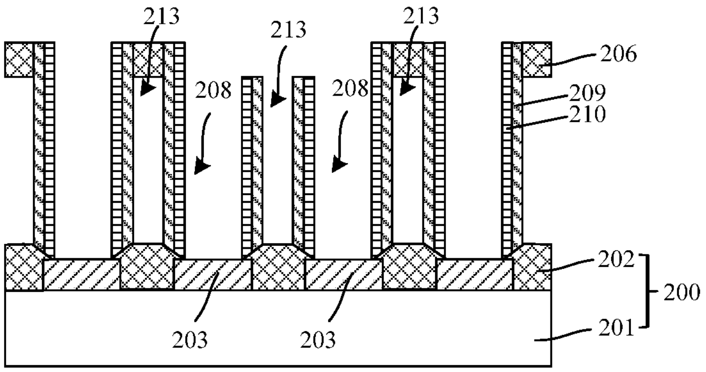

With reference to FIG. 10, the remaining sacrifice layer 205 (with reference to FIG. 9) between the external electrode layers 209 is removed, to form a cavity 213 at a position where the remaining sacrifice layer 205 has been removed.

The remaining sacrifice layer 205 between the external electrode layers 209 is removed along the surface of the exposed sacrifice layer, and the sacrifice layer 205 is removed by an isotropic wet etching process. In this embodiment, an etching solution used in the wet etching is hydrofluoric acid.

In the present application, the external electrode layer 209 is first formed on the sidewall of the capacitor via, and then the dielectric layer 210 is formed on the surface of the external electrode layer 209. Although one side of the external electrode layer 209 is suspended (the cavity 213) after the remaining sacrifice layer 205 is removed to form the cavity 213, the external electrode layer 209 will not bend or is not prone to bend to cause a short circuit, since the dielectric layer 210 is provided on the surface on the other side of the external electrode layer 209 and the dielectric layer 210 and the external electrode layer 209 support each other. After the cavity 213 is formed, the internal electrode layer is subsequently formed on the surface of the dielectric layer 210 and the bottom surface of the capacitor via 208. The surface on one side of the internal electrode layer can be supported by the double-layer structure of the dielectric layer 210 and the external electrode layer 209. Therefore, the internal electrode layer also will not bend or is also not prone to bend to cause a short circuit, thereby improving the electrical performance of the capacitor.

Figure 11:
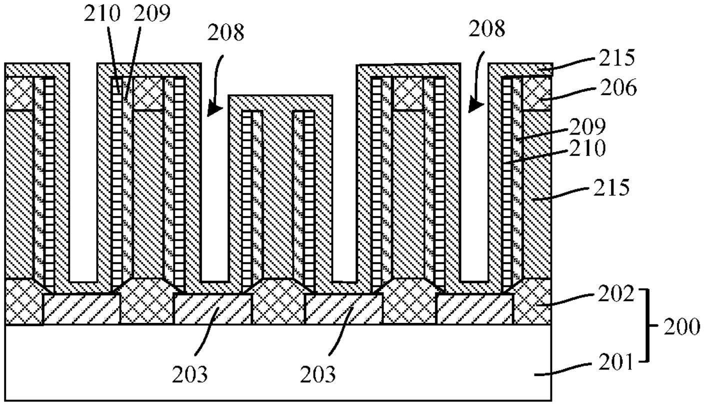
Figure 12:
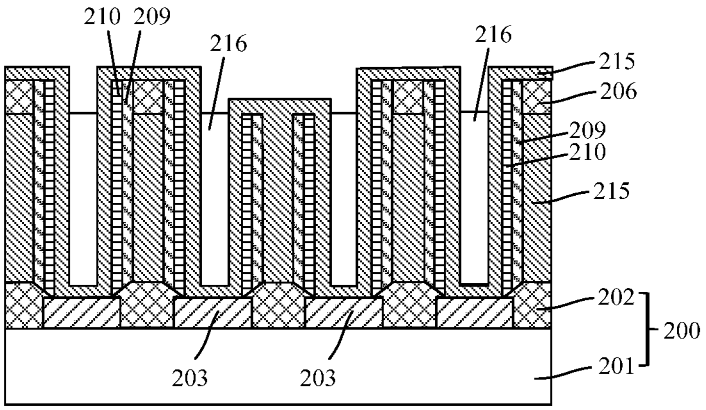
Figure 13:
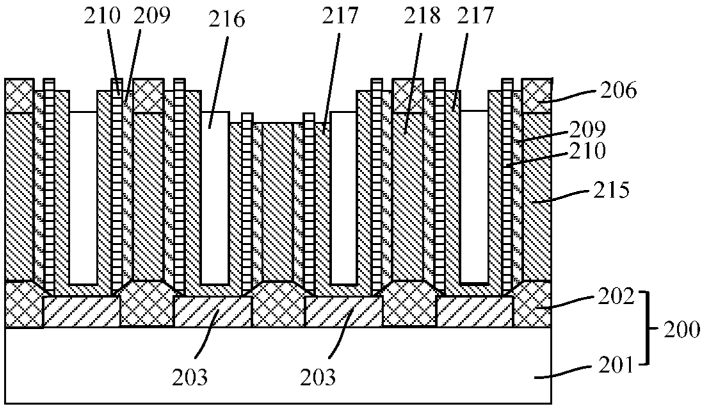

With reference to FIG. 11 to FIG. 13, an internal electrode layer 217 (with reference to FIG. 13) is formed on the surface of the dielectric layer 210 and the bottom surface of the capacitor via 208 (with reference to FIG. 10). A first conductive layer 218 (with reference to FIG. 13) completely filling the cavity 213 (with reference to FIG. 10) is formed. The first conductive layer 218 is in contact with the external electrode layer 209. A second conductive layer 216 completely filling the remaining part of the capacitor via on the internal electrode layer 217 (with reference to FIG. 12).

In this embodiment, the operation that the internal electrode layer 217 on the surface of the dielectric layer 210 and the bottom surface of the capacitor via and the operation that the first conductive layer 218 completely filling the cavity is formed are synchronously performed and include the following operations. With reference to FIG. 10 and FIG. 11, an internal electrode material layer 215 is formed in the cavity 213, on a surface of the support layer 206, on a surface of the dielectric layer 210, and at a bottom of the capacitor via 208. With reference to FIG. 12, after the internal electrode material layer 215 is formed, the second conductive layer 216 completely filling the remaining part of the capacitor via is formed on the internal electrode material layer 215. With reference to FIG. 13, after the second conductive layer 216 is formed, the internal electrode material layer in the cavity is disconnected from the internal electrode material layer in the capacitor via, in which the remaining part of the internal electrode material layer in the cavity forms the first conductive layer 218, and the remaining part of the internal electrode material layer in the capacitor via forms the internal electrode layer 217. Through the foregoing process, a process of forming the first conductive layer 218 and a process of forming the internal electrode layer 217 may be performed synchronously, thereby reducing process operations. In addition, after the second conductive layer 216 is formed, the second conductive layer 216 and the dielectric layer 210 may directly define a part of the internal electrode material layer that needs to be removed. Therefore, the internal electrode material layer is directly etched away without forming a mask layer, thereby further reducing process operations.

In some embodiments, the internal electrode material layer 215 may be a single-layer structure formed by one material of W, Al, Cu, Ag, Au, Co, Pt, Ni, Ti, Ta, TiN, TaN, TaC, TaSiN, NiSi, CoSi, TiAl, and WSi, or the internal electrode material layer 215 may be a stack structure formed by more than two materials in a group formed by the foregoing materials. In this embodiment, the internal electrode material layer 215 is a TiN layer.

In some embodiments, the material of the second conductive layer 216 may be different from the material of the internal electrode material layer 215. The material of the second conductive layer 216 may be doped polycrystalline silicon, and may be specifically N-type polycrystalline silicon or P-type polycrystalline silicon.

In some embodiments, a process of forming the second conductive layer 216 includes the following operations. A second conductive material layer is formed on the internal electrode material layer 215, where the second conductive material layer completely fills the remaining part of the capacitor via. The second conductive material layer is etched back to remove a partial thickness of the second conductive material layer, and the second conductive layer 216 completely filling the remaining part of the capacitor via is formed on the internal electrode material layer 215.

The first conductive layer 218 and the external electrode layer 209 are in contact with each other to form an external electrode of the capacitor together, and the second conductive layer 216 and the internal electrode layer 217 are in contact with each other to form an internal electrode of the capacitor together.

Figure 14:
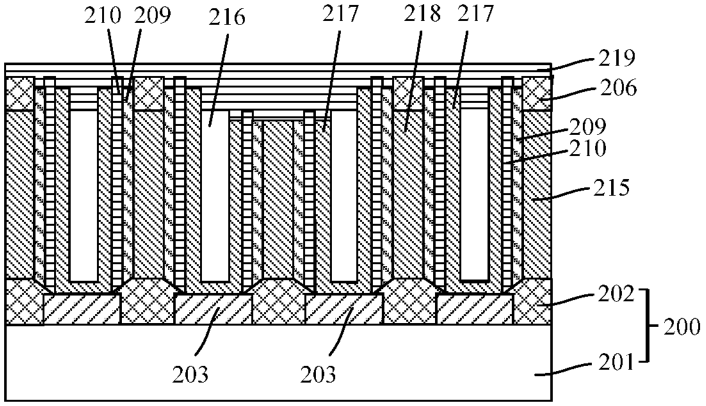

With reference to FIG. 14, an isolation layer 219 covering the second conductive layer 216, the dielectric layer 210, the external electrode layer 209, the internal electrode layer 217, and the support layer 206 is formed.

The isolation layer 219 is configured to electrically isolate various structures of various capacitors from each other. In some embodiments, the isolation layer 219 may be a single-layer structure formed by one material of a high-K dielectric material, silicon oxide, silicon nitride, silicon oxynitride, silicon oxycarbide, and silicon carbon nitride, or the isolation layer 219 may be a stack structure formed by more than two materials in a group formed by the foregoing materials. The high-K dielectric material may be one or more of $HfO_2$, $TiO_2$, HfZrO, HfSiNO, $Ta_2O_5$, $ZrO_2$, $ZrSiO_2$, $Al_2O_3$, $SrTiO_3$, and BaSrTiO. A forming process of the isolation layer 219 may be normal-pressure or low-pressure Chemical Vapor Deposition (CVD), Plasma Enhanced Chemical Vapor Deposition (PECVD), Thermal Chemical Vapor Deposition (Thermal CVD), High-Density Plasma Chemical Vapor Deposition (HDPCVD), a high aspect ratio deposition process (HARPCVD), Physical Vapor Deposition (PVD), Atomic Layer Deposition (ALD), or a plasma vapor deposition process.

Figure 15:
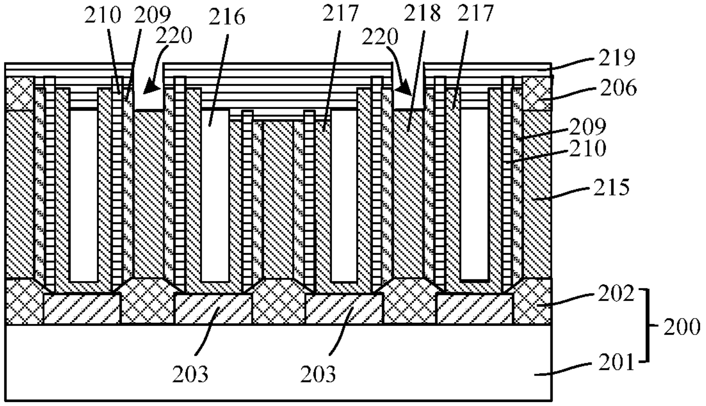
Figure 16:
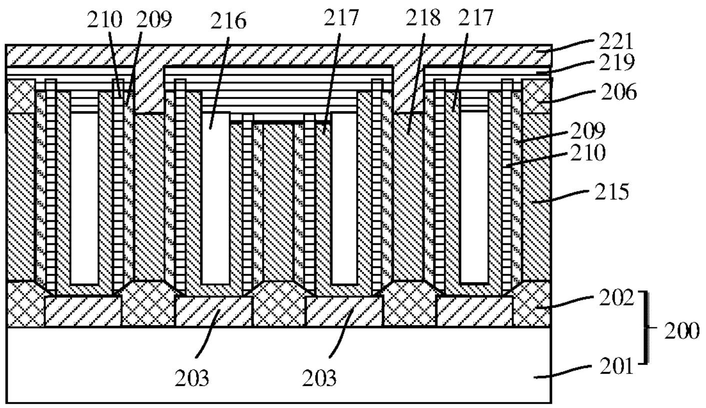

With reference to FIG. 15, a plurality of openings 220 exposing the first conductive layer 218 and the external electrode layer 209 are formed in the isolation layer 219. With reference to FIG. 16, a connection structure 221 electrically connected with the first conductive layer 218 and the external electrode layer 209 is formed on a surface of the isolation layer 219 and in the openings 220.

The connection structure 221 connects all the separate external electrode layers 209 together. The material of the connection structure 221 is a metal. In some embodiments, the connection structure 221 may be a single-layer structure formed by one material of W, Al, Cu, Ag, Au, Pt, Ni, Ti, TiN, TaN, Ta, TaC, TaSiN, WN, and WSi, or the connection structure 221 may be a stack structure formed by more than two materials in a group formed by the foregoing materials.

Some embodiments of the present application further provide a semiconductor structure, with reference to FIG. 16, including:

a base 200;

a plurality of separate ring-shaped external electrode layers 209 located on the base 200;

a dielectric layer 210 located on an inner sidewall of each external electrode layer 209;

an internal electrode layer 217 located on an inner sidewall of the dielectric layer 210 and a surface of the base in a ring of each external electrode layer 209;

a first conductive layer 218 filling a space outside the ring of each external electrode layer 209, where the first conductive layer 218 is in contact with a respective one of the external electrode layers 209;

a second conductive layer 216 filling a space inside the ring of the internal electrode layer 217, where the second conductive layer 216 is in contact with the internal electrode layer 217;

an isolation layer 219 covering the second conductive layer 216, the dielectric layer 210, the external electrode layers 209, and the internal electrode layer 217, where an opening exposing the first conductive layer 218 and the external electrode layers 209 is formed in the isolation layer 219; and a connection structure 221 that is located on a surface of the isolation layer 219 and in the opening and is connected with the first conductive layer 218 and each external electrode layer 209.

In some embodiments, a plurality of electrode contact structures 203 are provided in the base 200, adjacent electrode contact structures 203 are isolated from each other by an insulating layer 202, and the internal electrode layer 217 is connected to a respective one of the electrode contact structures 203.

In some embodiments, the external electrode layer 209, the first conductive layer 218, and the internal electrode layer 217 are made of the same material.

In some embodiments, each of an external electrode material layer, the first conductive layer, and the internal electrode layer may be a single-layer structure formed by one material of W, Al, Cu, Ag, Au, Co, Pt, Ni, Ti, Ta, TiN, TaN, TaC, TaSiN, NiSi, CoSi, TiAl, and WSi, or each of an external electrode material layer, the first conductive layer, and the internal electrode layer may be a stack structure formed by more than two materials in a group formed by the foregoing materials.

In some embodiments, the material of the second conductive layer 216 is doped polycrystalline silicon, and the material of the dielectric layer 210 is a high dielectric constant (K) material.

In some embodiments, a support layer 206 is further provided between the external electrode layers 209, and the support layer 206 is in contact with an outer sidewall of the external electrode layers 209.

Although the present application has been disclosed above with preferred embodiments, the embodiments are not used to limit the present application. Any person skilled in the art can make possible variations and changes to the technical solution of the present application by using the method and technical content disclosed above without departing from the spirit and scope of the present application. Therefore, any simple changes, equivalent variations, and modifications made to the above embodiments according to the technical essence of the present application without departing from the content of the technical solution of the present application fall within the scope of protection of the technical solution of the present application.

The invention claimed is:

1. A method for forming a semiconductor structure, comprising:

providing a base;

forming a sacrifice layer and a support layer located on the sacrifice layer on the base;

removing a part of the support layer and a part of the sacrifice layer, to form a plurality of capacitor vias in the support layer and the sacrifice layer;

forming external electrode layers on sidewall surfaces of the capacitor vias;

forming a dielectric layer on a sidewall surface of each external electrode layer;

removing remaining sacrifice layer between the external electrode layers to form a cavity at a position where the remaining sacrifice layer has been removed;

forming an internal electrode layer on a surface of the dielectric layer and a bottom surface of each capacitor via, and synchronously forming a first conductive layer completely filling the cavity, wherein the first conductive layer is in contact with a respective one of the external electrode layers;

forming a second conductive layer completely filling a remaining part of each capacitor via on the internal electrode layer;

forming an isolation layer covering the second conductive layer, the dielectric layer, the external electrode layers, the internal electrode layer, and the support layer;

forming a plurality of openings exposing the first conductive layer and the external electrode layers in the isolation layer; and forming a connection structure electrically connected with the first conductive layer and the external electrode layers on a surface of the isolation layer and in the openings.

2. The method for forming the semiconductor structure according to claim 1, wherein a plurality of electrode contact structures are formed in the base, adjacent electrode contact structures of the plurality of electrode contact structures are isolated from each other by an insulating layer, and each of the plurality of capacitor vias exposes a respective one of the plurality of electrode contact structures.

3. The method for forming the semiconductor structure according to claim 2, wherein a material of the sacrifice layer is different from a material of the support layer and a material of the insulating layer.

4. The method for forming the semiconductor structure according to claim 3, wherein forming the plurality of capacitor vias in the support layer and the sacrifice layer comprises: removing a part of the support layer and a part of the sacrifice layer by a dry etching process, to form initial capacitor vias in the support layer and the sacrifice layer; thinning the sacrifice layer on sidewalls of the initial capacitor vias by a first wet etching process, to increase a dimension of each of the initial capacitor vias; and removing a part of the support layer and a part of the insulating layer by a second wet etching process, to form the capacitor vias.

5. The method for forming the semiconductor structure according to claim 4, wherein a minimum thickness of the sacrifice layer between adjacent capacitor vias is less than one fifth of a diameter of each of the capacitor vias.

6. The method for forming the semiconductor structure according to claim 1, wherein forming the external electrode layers comprises: forming an external electrode material layer on the sidewall surfaces and the bottom surfaces of the capacitor vias and a surface of the support layer; and removing the external electrode material layer on the bottom surfaces of the capacitor vias and the surface of the support layer by a maskless etching process, wherein a remaining part of the external electrode material layer on the sidewall surfaces of the capacitor vias forms the external electrode layers.

7. The method for forming the semiconductor structure according to claim 1, wherein forming the dielectric layer comprises: forming a dielectric material layer on the sidewall surfaces of the external electrode layers, the bottom surfaces of the capacitor vias, and a surface of the support layer; and removing the dielectric material layer on the bottom surfaces of the capacitor vias and the surface of the support layer by a maskless etching process, wherein a remaining part of the dielectric material layer on the sidewall surfaces of the external electrode layers forms the dielectric layer.

8. The method for forming the semiconductor structure according to claim 1, wherein forming the internal electrode layer on the surface of the dielectric layer and the bottom surface of each capacitor via, and synchronously forming the first conductive layer completely filling the cavity comprises: forming an internal electrode material layer in the cavity, on a surface of the support layer, on the surface of the dielectric layer, and at a bottom of each capacitor via; after the internal electrode material layer is formed, forming the second conductive layer completely filling the remaining part of each capacitor via on the internal electrode material layer; and after the second conductive layer is formed, disconnecting the internal electrode material layer in the cavity from the internal electrode material layer in the capacitor vias, in which a remaining part of the internal electrode material layer in the cavity forms the first conductive layer, and a remaining part of the internal electrode material layer in the capacitor vias forms the internal electrode layer.

9. The method for forming the semiconductor structure according to claim 1, wherein after the dielectric layer is formed, removing the remaining sacrifice layer between the external electrode layers to form the cavity at the position where the remaining sacrifice layer has been removed comprises: forming a mask layer on a surface of the support layer, a top surface of each external electrode layer, and a top surface of the dielectric layer, and above the capacitor vias, and forming a first opening exposing the surface of a part of the support layer between adjacent capacitor vias in the mask layer; etching the exposed support layer along the first opening by using the mask layer as a mask, to expose a surface of the sacrifice layer at a bottom; removing all the sacrifice layer along the exposed sacrifice layer, to form the cavity at the position where the sacrifice layer has been removed; and removing the mask layer.

10. A semiconductor structure, comprising:

a base;

a plurality of separate ring-shaped external electrode layers located on the base;

a dielectric layer located on an inner sidewall of each external electrode layer;

an internal electrode layer located on an inner sidewall of the dielectric layer and a surface of the base in a ring of each external electrode layer;

a first conductive layer filling a space outside the ring of each external electrode layer, wherein the first conductive layer is in contact with a respective one of the external electrode layers, and the first conductive layer and the internal electrode layer are formed synchronously;

a second conductive layer filling a space inside the ring of the internal electrode layer, wherein the second conductive layer is in contact with the internal electrode layer;

an isolation layer covering the second conductive layer, the dielectric layer, the external electrode layers, and the internal electrode layer, wherein an opening exposing the first conductive layer and the external electrode layers is formed in the isolation layer; and a connection structure that is located on a surface of the isolation layer and in the opening and is directly connected with the first conductive layer and each external electrode layer.

11. The semiconductor structure according to claim 10, wherein a plurality of electrode contact structures are provided in the base, adjacent electrode contact structures of the plurality of electrode contact structures are isolated from each other by an insulating layer, and each of the external electrode layers is connected to a respective one of the plurality of electrode contact structures.

12. The semiconductor structure according to claim 10, wherein the external electrode layers, the first conductive layer, and the internal electrode layer are made of the same material.

13. The semiconductor structure according to claim 12, wherein a material of the external electrode layers, the first conductive layer, and the internal electrode layer is titanium nitride.

14. The semiconductor structure according to claim 10, wherein a material of the second conductive layer is doped polycrystalline silicon, and a material of the dielectric layer is a high dielectric constant material.

15. The semiconductor structure according to claim 10, wherein a support layer is further provided between the external electrode layers, and the support layer is in contact with an outer sidewall of the external electrode layers.

16. A method for forming a semiconductor structure, comprising:

providing a base;

forming a sacrifice layer and a support layer located on the sacrifice layer on the base;

removing a part of the support layer and a part of the sacrifice layer, to form a plurality of capacitor vias in the support layer and the sacrifice layer;

forming external electrode layers on sidewall surfaces of the capacitor vias;

forming a dielectric material layer sidewall surfaces of the external electrode layers, bottom surfaces of the capacitor vias, and a surface of the support layer;

removing the dielectric material layer on the bottom surfaces of the capacitor vias and the surface of the support layer by a maskless etching process, wherein a remaining part of the dielectric material layer on the sidewall surfaces of the external electrode layers forms a dielectric layer;

removing remaining sacrifice layer between the external electrode layers to form a cavity at a position where the remaining sacrifice layer has been removed;

forming an internal electrode layer on a surface of the dielectric layer and a bottom surface of each capacitor via;

forming a first conductive layer completely filling the cavity, wherein the first conductive layer is in contact with a respective one of the external electrode layers;

forming a second conductive layer completely filling a remaining part of each capacitor via on the internal electrode layer;

forming an isolation layer covering the second conductive layer, the dielectric layer, the external electrode layers, the internal electrode layer, and the support layer;

forming a plurality of openings exposing the first conductive layer and the external electrode layers in the isolation layer; and forming a connection structure electrically connected with the first conductive layer and the external electrode layers on a surface of the isolation layer and in the openings.

17. The method for forming the semiconductor structure according to claim 16, wherein a plurality of electrode contact structures are formed in the base, adjacent electrode contact structures of the plurality of electrode contact structures are isolated from each other by an insulating layer, and each of the plurality of capacitor vias exposes a respective one of the plurality of electrode contact structures.

18. The method for forming the semiconductor structure according to claim 17, wherein a material of the sacrifice layer is different from a material of the support layer and a material of the insulating layer.

19. The method for forming the semiconductor structure according to claim 18, wherein forming the plurality of capacitor vias in the support layer and the sacrifice layer comprises: removing a part of the support layer and a part of the sacrifice layer by a dry etching process, to form initial capacitor vias in the support layer and the sacrifice layer; thinning the sacrifice layer on sidewalls of the initial capacitor vias by a first wet etching process, to increase a dimension of each of the initial capacitor vias; and removing a part of the support layer and a part of the insulating layer by a second wet etching process, to form the capacitor vias.

20. The method for forming the semiconductor structure according to claim 19, wherein a minimum thickness of the sacrifice layer between adjacent capacitor vias is less than one fifth of a diameter of each of the capacitor vias.

* * * * *